United States Patent
Venkatachary

(10) Patent No.: US 7,555,594 B2
(45) Date of Patent: Jun. 30, 2009

(54) RANGE REPRESENTATION IN A CONTENT ADDRESSABLE MEMORY (CAM) USING AN IMPROVED ENCODING SCHEME

(75) Inventor: Srinivasan Venkatachary, Sunnyvale, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 480 days.

(21) Appl. No.: 11/428,381

(22) Filed: Jun. 30, 2006

(65) Prior Publication Data

US 2006/0262583 A1 Nov. 23, 2006

Related U.S. Application Data

(63) Continuation-in-part of application No. 10/897,062, filed on Jul. 22, 2004.

(60) Provisional application No. 60/696,128, filed on Jun. 30, 2005.

(51) Int. Cl.
*G06F 12/00* (2006.01)

(52) U.S. Cl. .......................... 711/108; 711/E12.017; 365/49.1

(58) Field of Classification Search .............. 711/108; 365/49.1
See application file for complete search history.

(56) References Cited

U.S. PATENT DOCUMENTS

| | | | |
|---|---|---|---|
| 5,848,435 A | 12/1998 | Brant et al. | |
| 6,181,592 B1 | 1/2001 | Aoki | |
| 6,266,262 B1 | 7/2001 | Washburn et al. | |
| 6,502,163 B1 | 12/2002 | Ramankutty | |
| 6,502,270 B2 | 1/2003 | Voelkel et al. | |
| 6,700,889 B1 | 3/2004 | Nun | |
| 6,775,737 B1 * | 8/2004 | Warkhede et al. | 711/108 |
| 6,906,936 B1 * | 6/2005 | James et al. | 365/49.17 |
| 2004/0064444 A1 * | 4/2004 | Villaret et al. | 707/3 |
| 2004/0258043 A1 * | 12/2004 | Engbersen et al. | 370/351 |

OTHER PUBLICATIONS

"Algorithms for Advanced Packet Classification with Ternary CAMs," Lakshminarayanan et al., ACM SIGCOMM '05, Aug. 21-26, 2005 Philadelphia Pennsylvania.

"Fast scalable level-four switching," Srinivasan et al., ACM SIGCOMM Computer Communication Review, 1998 vol. 28, Issue 4, pp. 191-202.

* cited by examiner

*Primary Examiner*—Matt Kim
*Assistant Examiner*—Michael C Krofcheck
(74) *Attorney, Agent, or Firm*—Shemwell Mahamedi LLP; William L. Paradice, III

(57) ABSTRACT

In a method and apparatus for encoding a bit field within a memory device, the bit field is encoded in a manner that requires fewer memory device entries and fewer encoded bits per entry than conventional encoding schemes.

18 Claims, 8 Drawing Sheets

| Config | Chunk Distribution | FE7 | FE6 | FE5 | FE4 | FE3 | FE2 | FE1 | FE0 | Bit Steering |
|---|---|---|---|---|---|---|---|---|---|---|
| 000 | 2/2/2/2/2/2/2/2 | 2:3 | 2:3 | 2:3 | 2:3 | 2:3 | 2:3 | 2:3 | 2:3 | 3/3/3/3/3/3/3/3 |
| 001 | 4/4/4/4 | 4:15 | 4:15 | 4:15 | 4:15 | -- | -- | -- | -- | 15/15/15/15/--/--/--/-- |
| 010 | 3/3/3/3/4 | 3:7 | 3:7 | 3:7 | 3:7 | 4:15 | -- | -- | -- | 7/7/7/7/15/--/--/-- |
| 011 | 3/3/3/4/3 | 3:7 | 3:7 | 3:7 | 4:15 | 3:7 | -- | -- | -- | 7/7/7/15/7/--/--/-- |
| 100 | 3/3/4/3/3 | 3:7 | 3:7 | 4:15 | 3:7 | 3:7 | -- | -- | -- | 7/7/15/7/7/--/--/-- |
| 101 | 3/4/3/3/3 | 3:7 | 4:15 | 3:7 | 3:7 | 3:7 | -- | -- | -- | 7/15/7/7/7/--/--/-- |
| 110 | 4/3/3/3/3 | 4:15 | 3:7 | 3:7 | 3:7 | 3:7 | -- | -- | -- | 15/7/7/7/7/--/--/-- |

| Range | Prefix Encoding (b1 b0) | Unary Encoding (b3b2 b1b0) | Fence Encoding (b1 b0 $b_{ex}$) |
|---|---|---|---|
| >= 0 | xx | xx xx | xx x |
| >= 1 | 01, 1x | 0x xx | xx 1 |
| >= 2 | 1x | 00 xx | x1 1 |
| >= 3 | 11 | 00 0x | 11 1 |

FIG. 4

| Range | Unary Representation | Fence Representation |
|---|---|---|
| = i | $0^i \, x \, 0^{(2^k-i-1)}$ | $0^{(2^k-i-1)} 1^i$ |
| >= i | $0^i \, x^{(2^k-i)}$ | $x^{(2^k-i-1)} \, 1^i$ |
| < i | $x^i \, 0^{(2^k-i)}$ | $0^{(2^k-i)} x^{(i-1)}$ |
| [ i,j ] | $0^i \, x^{(j-i+1)} \, 0^{(2^k-j-1)}$ | $0^{(2^k-1-j)} x^{(j-i)} 1^i$ |

FIG. 5

| Range | Prefix Encoding (b1 b0) | Unary Encoding (b3 b2 b1 b0) | Fence Encoding (b1 b0 $b_{ex}$) |
|---|---|---|---|
| [0,0] | 00 | 00 01 | 00 0 |
| [1,1] | 01 | 00 10 | 00 1 |
| [2,2] | 10 | 01 00 | 01 1 |
| [3,3] | 11 | 10 00 | 11 1 |
| [0,1] | 0x | 00 xx | 00 x |
| [0,2] | 0x,10 | 0x xx | 0x x |
| [0,3] | xx | xx xx | xx x |
| [1,2] | 01,10 | 0x x0 | 0x 1 |
| [1,3] | 01,1x | xx x0 | xx 1 |
| [2,3] | 1x | xx 00 | x1 1 |

FIG. 6

Form_TCAM_Entries( $s$, $e$, $k1$, $k2$, . . ., $kl$ )

if( $s = e$ )
return the TCAM encoding of $s$

// Form entries for the split chunk
$c \leftarrow$ Find Split Chunk ($s$, $e$), where split chunk ($c$) is defined
  as the chunk such that $v_{sc} \neq v_{ec}$ and $v_{si} = v_{ei}$ for all $i < c$
Form TCAM entry corresponding to chunk ($c$) that covers the
  range $v_{sc}+1$ . . . $v_{ec}-1$ if( $c = l$ )
return the TCAM entry formed

// Form entries corresponding to $>=s$ portion of each chunk
Find $j$ such that for $c < j \leq l$, $v_{sj} \neq 0$ and $v_{si} = 0$ for all $i > j$
for( $i = c + 1$ to $j$ )
  Form TCAM entry corresponding to the chunk that covers
    the range $v_{si}$ . . . $2^{ki} -1$ // Form entries corresponding to $<=e$ portion of each chunk
Find $j$ such that for $c < j \leq l$, $v_{ej} \neq 2^{ki} - 1$ and $v_{ei} = 2^{ki} - 1$ for all $i > j$
for ( $i = c + 1$ to $j$ )
  Form TCAM entry corresponding to the chunk that covers
    the range $0$, . . . , $v_{ei}$ return all TCAM entries formed

FIG. 7

| Number of chunks/ Number of bits per chunk | # of extra bits used per TCAM entry | Worst case Expansion |
| --- | --- | --- |
| 16 chunks/ 1 bit at a time | 0 | 30 |
| 8 chunks/ 2 bits at a time | 8 | 15 |
| 5 chunks/ 4,3,3,3,3 | 27 | 9 |
| 4 chunks/ 4,4,4,4 | 44 | 7 |
| 3 chunks/ 6, 5, 5 | 109 | 5 |

FIG. 8

| # of extra bits used per TCAM entry | Worst case Expansion | Expansion factor | Increase in capacity (%) |
| --- | --- | --- | --- |
| 0 | 30 | 2.69 | 0% |
| 8 | 15 | 2.08 | 29% |
| 18 | 11 | 1.79 | 50% |
| 36 | 8 | 1.57 | 71% |

FIG. 9

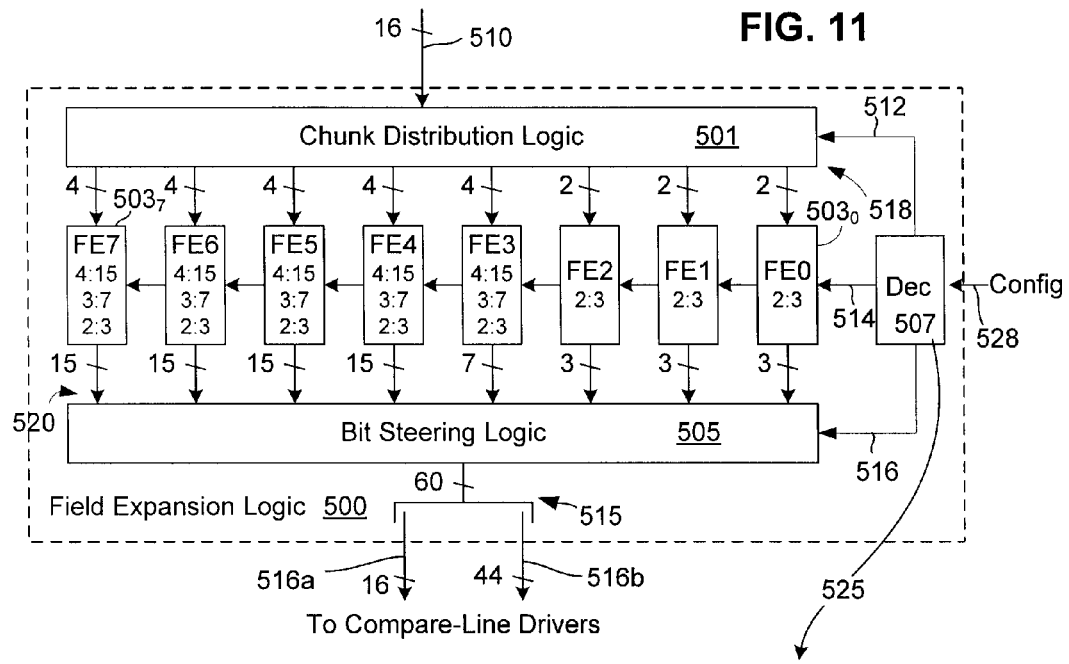
FIG. 11
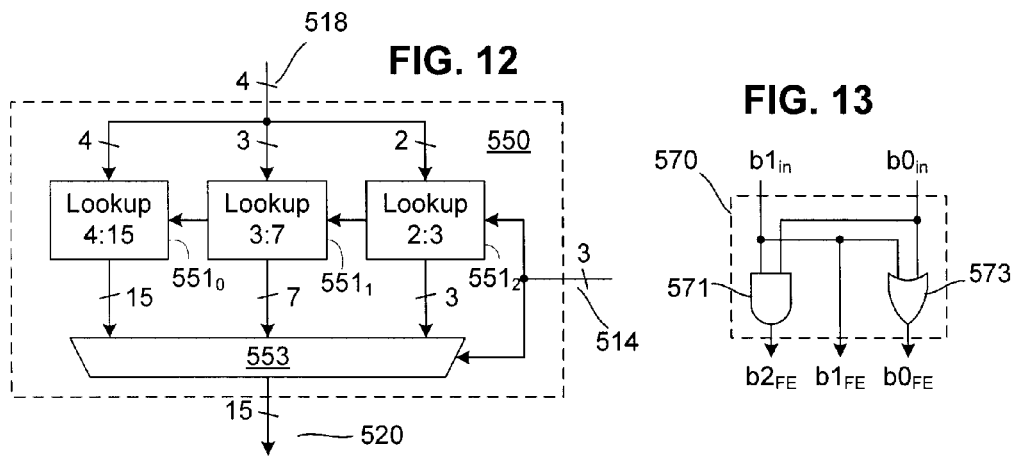
FIG. 12
FIG. 13

RANGE REPRESENTATION IN A CONTENT ADDRESSABLE MEMORY (CAM) USING AN IMPROVED ENCODING SCHEME

CROSS-REFERENCE TO RELATED APPLICATIONS

This application claims priority from, and hereby incorporates by reference, U.S. Provisional Application No. 60/696,128, filed Jun. 30, 2005 and entitled "RANGE REPRESENTATION IN A CONTENT ADDRESSABLE MEMORY (CAM) USING AN IMPROVED ENCODING SCHEME." This application is also a continuation-in-part of, and hereby incorporates by reference, U.S. application Ser. No. 10/897,062 filed Jul. 22, 2004 and entitled "RANGE CODE COMPRESSION METHOD AND APPARATUS FOR TERNARY CONTENT ADDRESSABLE MEMORY (CAM) DEVICES."

TECHNICAL FIELD

The present invention relates to communication networks and, more particularly, to improved methods for encoding a range of values within a content addressable memory (CAM) device.

BACKGROUND

A communication network is generally recognized as an interconnection of forwarding devices that process and send packets of information across the network. The network can either be an Internet or an Intranet and the forwarding devices can be gateways, bridges, switches, or routers. One objective of the forwarding devices is to reliably forward the packets from a source to a destination.

In whatever form, a forwarding device typically includes one or more lookup tables. An incoming destination address (or other search key) is derived from a packet of information and compared against entries stored within the lookup table. Resulting from the search, the associated packet of information may be processed according to a set of rules and sent to an appropriate output port of the forwarding device. As links of the network change, routing protocols exchange information among the forwarding devices in order to change the entries stored within the corresponding lookup tables. This change will modify not only the entries within the lookup table, but also the next-hop identifiers or other associated data pointed to by the addresses of those entries. Routing through the forwarding devices can, therefore, be changed dynamically as links go down and come back up in various parts of the Internet or Intranet.

High-speed packet classification algorithms, which scale to large multi-field databases, have recently become a widespread requirement for a variety of applications, such as network security appliances, quality of service filtering and load balancers. For classifying packets, a forwarding device (e.g., a router) may employ a classification database (also called a policy database), which has several access control lists (ACLs). Each ACL consists of several rules that may be applied to incoming and/or outgoing packets. While the syntax of these rules varies based on the router vendor, the semantics of the rules allows similar classification information to be specified—i.e., the rules allow various patterns to be defined based on the packet header. Furthermore, a set of actions is specified for each rule, and these actions are applied to all packets that match the rule.

Designing highly scalable algorithms that support millions of rules and several million searches per second has been, and continues to be, an important stream of research. Several advances in algorithmic approaches that use off-chip random access memories have been made in the past. However, in the past few years, the industry has increasingly employed Ternary Content Addressable Memories (TCAMs) for performing packet classification. A large class of current and next generation systems that require a few ten to a few hundred thousand rules have adopted TCAMs for packet classification at multi-gigabit speeds.

A TCAM is a memory device that stores data as a massive array of fixed-width ternary entries. A ternary entry may be described as a string of bits, where each bit is either a 0, 1 or x (don't care). Memory searches are performed quickly in a TCAM by comparing a search key against all TCAM entries in parallel. When the content stored in a TCAM memory location does not match the search key, the TCAM device returns a "no match" indication. If a match is found, however, the TCAM device returns a "match" indication by asserting the match line for that entry.

Two main characteristics that make TCAMs suitable for router design include deterministic search throughput and deterministic capacity. As of this writing, current TCAMs can support up to 133 million searches per second for 144-bit wide search keys. Current TCAMs can also store up to 128K ternary entries (that are 144 bits wide) in a single device. While TCAMs are well suited for performing high-speed searches on databases with ternary entries, certain limitations tend to reduce the efficiency of the TCAM memory device.

For example, TCAM efficiency is often limited because multiple TCAM entries are typically needed to store a rule having one or more range fields (e.g., the source and destination port fields in IP router ACLs usually have ranges). Since ranges cannot be directly stored in a TCAM, they are usually converted into a set of prefixes, and each prefix is stored in a separate TCAM entry. When the range-to-prefix expansion technique is applied to source and destination port fields, which are 16 bits wide, a rule with a single range field can consume up to 30 TCAM entries (in the worst case). Larger range fields would obviously consume even more TCAM entries, thus, further reducing the efficiency and storage capacity of the TCAM device.

Therefore, a need remains for an improved method for encoding a range field within a TCAM device, using fewer TCAM entries than used by conventional encoding schemes for the same bit width. Such a method could be used to increase the efficiency and storage capacity of pre-existing TCAM devices without hardware modification.

SUMMARY OF THE INVENTION

The following description of various embodiments of communication networks and methods is not to be construed in any way as limiting the subject matter of the appended claims.

According to one embodiment, a method is provided herein for encoding a bit field within a memory device, where said encoding uses fewer memory device entries and fewer encoded bits per entry than conventional encoding schemes.

In some cases, the method described herein may include dividing a bit field with W-bits into L portions, where L is an integer value less than or equal to W. For example, a range field having 16 bits may be divided into 16, 8, 5, 4, or 3 portions, where each portion has the same or a different number of bits. In some cases, the method may include encoding each of the L portions one at a time, such that each encoded portion is stored within a separate entry of the memory device along with a certain number of extra bits. For example, the extra bits may be used to ensure that a maximum number of entries, $N_{MAX}$, consumed by the process of dividing and encoding does not exceed $2*(W/L)-1$. If the 16-bit range field is divided into 4 portions, a certain number of extra bits (e.g., 44) may be used to ensure that the process of dividing and encoding does not exceed $2*(16/4)-1=7$.

In general, the certain number of extra bits may depend on the number of portions, L, and a desired number of entries, $N_{DESIRE}$, to be consumed by the process of dividing and encoding. For example, the certain number of extra bits per entry may increase as the number of portions, L, and the desired number of entries, $N_{DESIRE}$, decreases.

BRIEF DESCRIPTION OF THE DRAWINGS

Other objects and advantages of the invention will become apparent upon reading the following detailed description and upon reference to the accompanying drawings in which:

FIG. 4 is a table comparing the expansion of "≧" type ranges on a 2-bit range field using prefix encoding, unary encoding and fence encoding schemes;

FIG. 5 is a table comparing the formulas used for converting various k-bit range fields using the unary encoding and fence encoding schemes;

FIG. 6 is a table comparing the expansion results on various 2-bit range fields using prefix encoding, unary encoding and fence encoding schemes;

FIG. 7 illustrates exemplary pseudo-code for encoding a range of values into one or more TCAM entries using the fence encoding scheme;

FIG. 8 is a table illustrating the maximum number of TCAM entries needed (i.e., the worst-case expansion) to encode a range of values using the fence encoding scheme of FIG. 7 and various numbers of additional TCAM bits per entry;

FIG. 9 is a table showing the worst-case expansion (denoted in number of entries), the expansion factor and the resultant increase in capacity associated with the fence encoding scheme for various extra bits used in a single TCAM entry. The table entries were calculated using a database with ACLs totaling 215K rules;

FIG. 11 illustrates an embodiment of field expansion logic that may be used within the range expansion logic of FIG. 10 to perform chunk-based fence encoding on a bit field within a search key;

FIG. 12 illustrates an embodiment of a fence-encoding circuit that may be used within the field expansion logic of FIG. 11; and FIG. 13 illustrates a combinatorial logic circuit that may be used to perform a fence-encoding operation on a 2-bit input value.

Figure 1:
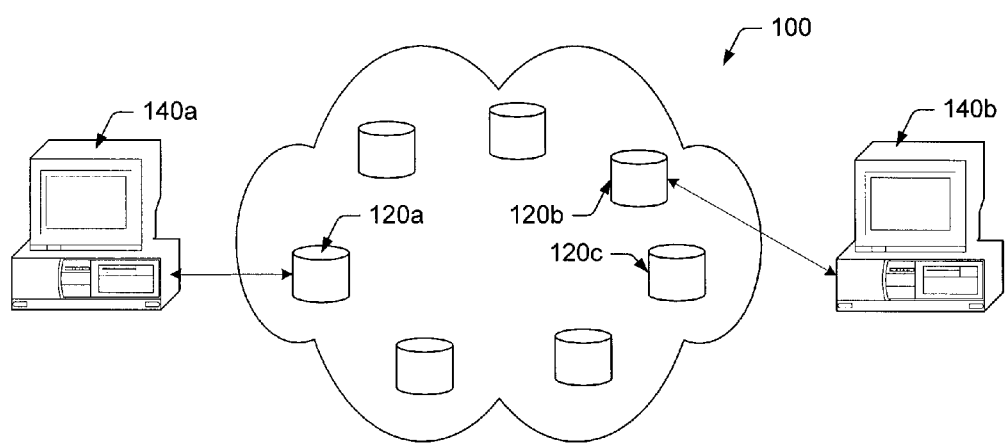
FIG. 1 is a block diagram of a communication network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Although the term "network" is specifically used throughout this disclosure, the term network is defined to include the Internet and other network systems, including public and private networks that use the Internet Protocol (IP) protocol suite for data transport. Examples include the Internet, Intranets, extranets, telephony networks ("using voice over IP"), and other wire-line and wireless networks that converge on the use of the IP family of protocols. Although the term "Internet" may be used throughout this disclosure, the term Internet is merely one example of an IP "network."

FIG. 1 illustrates possibly numerous forwarding devices 120 within a computer network 100. The topology of the Internet or the Intranet interposed between computers 140 can vary. If computer 140a wishes to send a packet of data to computer 140b, then it must do so by enabling the packet to traverse one or more forwarding devices 120 within network 100. Forwarding device 120a might receive the packet, which includes a destination address of, for example, forwarding device 120b (or computer 140b). Determining where to send the packet within network 100 so that the packet arrives at a forwarding device (or hop) closer to the destination, is essentially the function of the routing table within the forwarding device 120a. Optimally, the routing table within forwarding device 120a will receive the destination address, and will compare that address (or "search key") to prefix entries stored within the routing table. Associated with each prefix entry might be a next hop identifier. Thus, once a prefix entry is found that matches the destination address (using, for example, the longest prefix match comparison), the packet can be routed to the next hop to be one step closer to the intended destination.

Figure 2:
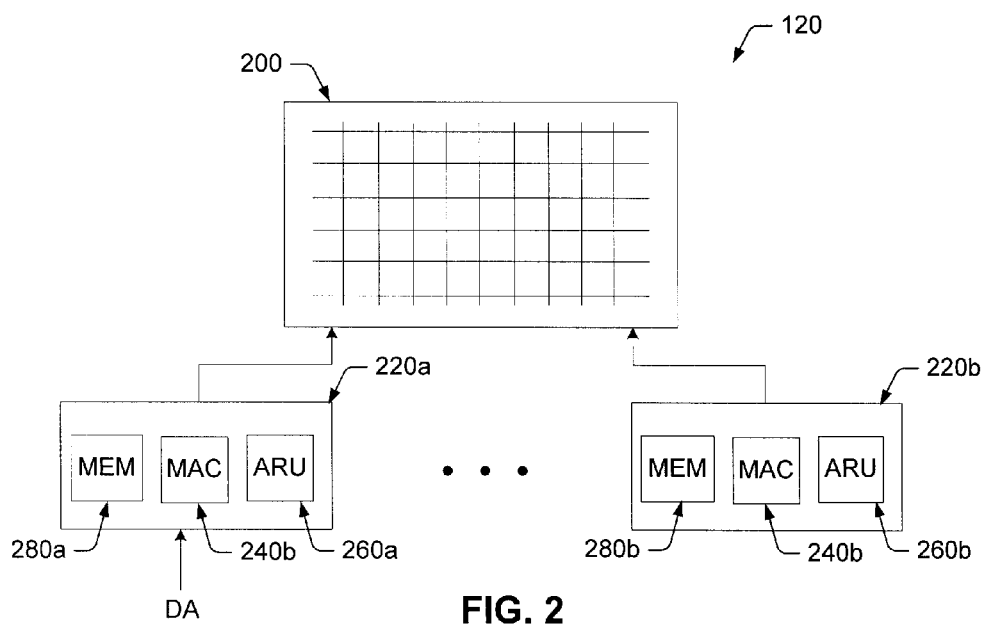
FIG. 2 is a block diagram of a packet-forwarding engine, or "forwarding device" (e.g., a switch or router) within the communication network of FIG. 1.

FIG. 2 illustrates one example of forwarding device 120, such as a router, gateway, bridge, or switch. Forwarding device 120 is often called a "packet-forwarding engine" and may contain a switching fabric 200 and a plurality of line cards 220. Switching fabric 200 is generally well known, and may involve a crossbar switch that interconnects all the line cards with one another. At least one line card may contain a routing processor. Forwarding device 120 can, therefore, be thought of as performing two functions: (i) performing route lookup based on the destination address of the packet in order to identify an outgoing port; and (ii) switching the packet to the appropriate output port.

The routing function can be performed primarily on the incoming line card (e.g., line card 220a), whereas switching of the packet to the appropriate output port or line card can take place within switching fabric 200. The Destination Address (DA) of the packet can enter line card 220a via an I/O interface. Each line card typically includes a Media Access Controller (MAC) 240, an Address Resolution Unit (ARU) 260, and a memory device 280. MAC 240 can be configured to accept many different communication protocols, such as, e.g., the Carrier Sense Multiple Access/Collision Detect (CSMA/CD), Fiber Distributed Data Interface (FDDI), or Asynchronous Transfer Mode (ATM) communication protocols. As packets are read from ingress MAC 240a, forwarding control information necessary for steering the packet through switching fabric 200 will be pre-appended and/or appended to those packets.

In some cases, the ARU 260 at the ingress line card may perform the routing function using the longest prefix match comparison technique. The ARU can perform classless or class-based routing functions and can support Variable Length Subnet Masks (VLSM). Each ARU can be reconfigured—as routes are added or deleted from the network—using well-known routing protocols, such as RIP, OSPF, or BGP. The memory device 280 can be implemented in various types of Random Access Memory (RAM), such as DRAM, SRAM, or Content-Addressable Memory (CAM), a popular form of masking CAM being Ternary CAM (or TCAM). Memory 280 may contain various lookup tables, such as a pointer table, a routing table and/or a next hop table. If one or more of the lookup tables are copied and placed within the line card 220, lookups on incoming packets can be performed locally, without loading the central processor of forwarding device 120.

In some cases, additional lookup tables may be included to make the overall routing algorithm "flow-aware." Instead of routing individual packets of data using a best-effort service, for example, the packets can be classified into specific flows. Routers or switches that are flow-aware may be used to classify incoming packets according to differentiated services. All packets belonging to the same flow may be treated in a similar manner.

A collection of rules or policies can be defined to determine whether a packet belongs to a specific flow before the packet is sent to its next hop. The rules or policies define an action to be applied to the packet, such as denying or allowing access to a protected network. Rules or policies that specify a particular flow are often based on the source address, destination address, and other designators within the incoming packet. For example, a packet filtering technique may use a rule or policy for denying all traffic from a particular Internet service provider (ISP) destined to a particular address. In addition to packet filtering, various rules may be employed to provide policy routing, rate-limiting, and traffic shaping abilities. Some or all of these rules may be defined within another lookup table—referred to herein as an access control list (ACL)—stored in a database.

Figure 3:
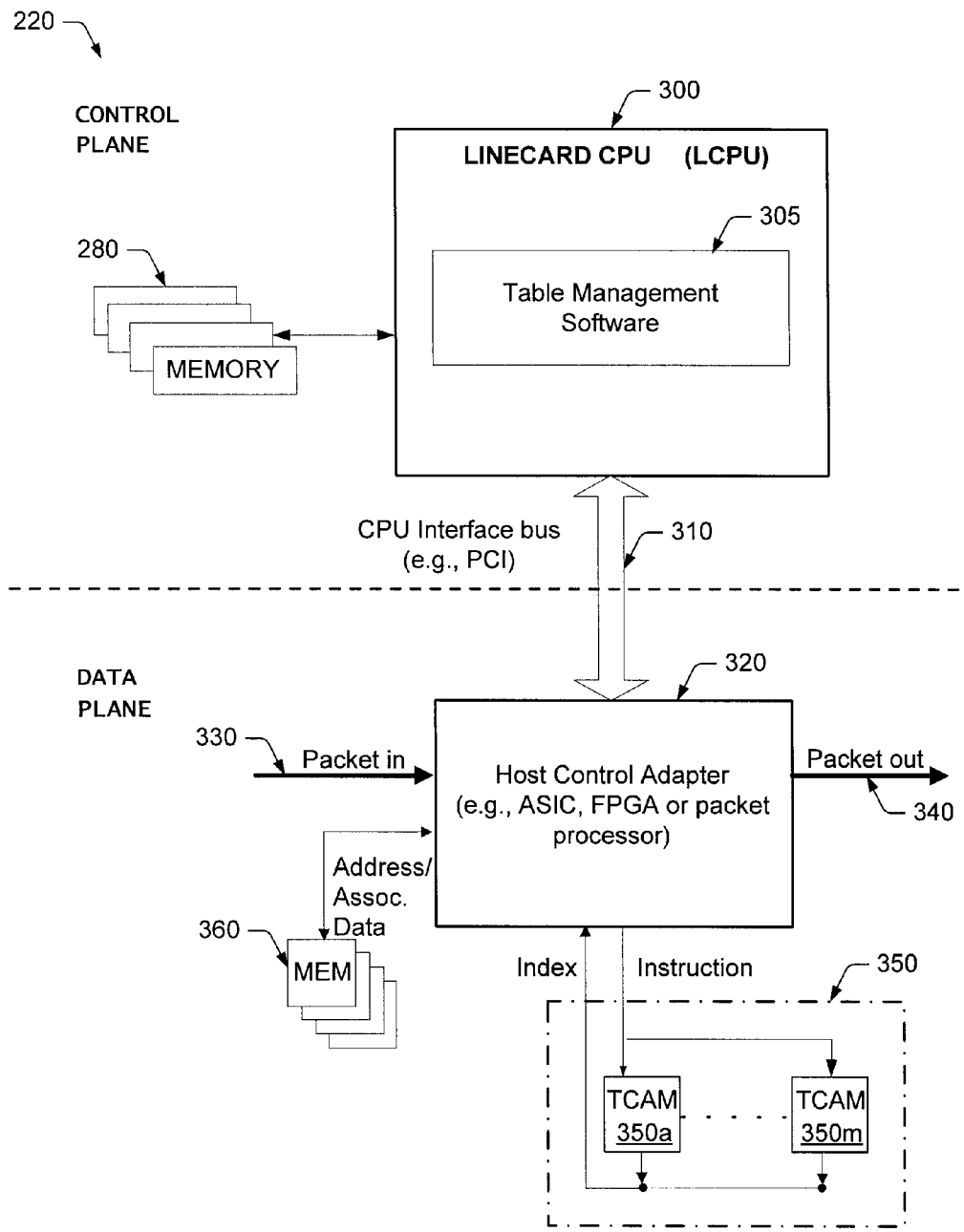
FIG. 3 is a block diagram of various software and hardware components that may be found within one or more line cards of the forwarding device of FIG. 2, including one or more ternary CAM (TCAM) arrays within a network search engine.

FIG. 3 illustrates various hardware and software components that may be included within one or more line cards 220 of forwarding device 120 (FIGS. 1 and 2). As will be described in more detail below, line card 220 may include one or more memory devices, each of which may be used for storing one or more lookup tables. Exemplary lookup tables may include, but are not limited to, routing tables, forwarding tables and ACL tables (which may include, e.g., filtering tables, Quality of Service tables, etc.).

As shown in FIG. 3, line card 220 may contain a Network Search Engine ("NSE") 350 in the data plane of the line card with supporting components in the control plane of the line card. In some cases, a central processor 300 (referred to as a line card CPU, or "LCPU") may be included within the control plane of line card 220 for managing the hardware components of the line card. For example, LCPU 300 may be configured for running table management software 305. In general, software 305 may be used to compute and maintain the lookup tables stored within memory 280 and NSE 350. Though control plane memory 280 may include substantially any type of memory device, a static or dynamic RAM device may be preferred in most embodiments of the invention. Control plane memory device 280 may be used for storing table management software 305, along with various lookup tables, including ACL tables, pointer tables, routing tables and next hop tables. The LCPU may communicate with the data plane components via interface bus 310.

Though a central processor (i.e., LCPU 300) is used herein for managing the forwarding database of a line card, such function should not be limited to a central processor in all embodiments of the invention. Other programmable units, such as, e.g., network processing units ("NPU"), custom designed Application Specific Integrated Circuits ("ASIC") or Field Programmable Gate Arrays ("FPGA") could replace LCPU 300 in alternative embodiments of the invention.

As shown in FIG. 3, a Host Control Adapter (HCA) 320 may be included within the data plane of line card 220 for handling and processing the data packets arriving at input port 330. HCA 320 could be, e.g., a custom-designed ASIC, FPGA or packet processor. The HCA is generally responsible for parsing the incoming data packets, extracting the destination address (or another search key), and performing the lookup in the forwarding tables stored within NSE 350. Though LCPU 300 and HCA 320 are both shown in the embodiment of FIG. 3, alternative embodiments of the invention may include only one processing device (e.g., LCPU 300 or HCA 320).

In some embodiments, NSE 350 may include an array of NSE modules (350a . . . 350m), in addition to the search engine software (not shown) that runs on the LCPU and manages the NSE array. The NSE array may be implemented in a variety of configurations, such as one search engine subsystem (i.e., one NSE array) on each line card in a distributed architecture, or one search engine subsystem on a centralized card. In a distributed architecture, control plane processing may be required for computing the forwarding table from the routing table. The control plane processing can be carried out independently on each line card, or on one centralized card.

As used here, the term "Network Search Engine" or "NSE" may refer to any device capable of: (i) storing a database of entries, (ii) using a search key to search for a particular entry within the database of entries and, as a result of the search, (iii) returning one or more indices of matching entries (i.e., entries that have at least one bit in common with the search key). The entries stored within the database can be "exact match entries" (e.g., complete IP destination addresses), "prefix entries" (e.g., one or more most significant bits of the IP destination address followed by a masked entry), or "range entries" (e.g., a match that occurs when a packet header field falls within a specified range, $R_i=[start_i, end_i]$, for ACL rule field i).

To perform packet classification, a classification database consisting of one or more access control lists (ACLs) may be stored within NSE 350. Each of the ACL tables may include several rules (e.g., a few tens to several thousands) that may be applied to incoming and/or outgoing packets. A set of actions is specified for each rule, and these actions are applied to all packets that match the rule. Due to the increasing number of rules in router ACL databases, a memory device capable of performing extremely fast searches is needed for storing the ACL entries.

In a preferred embodiment, NSE 350 may include one or more Content Addressable Memory (CAM) devices (350a to 350m) for storing the ACL entries, as well as other types of table entries (such as forwarding table entries). Exemplary CAM devices include binary, ternary, and pseudo-ternary CAMs. Binary CAMs are generally configured for storing binary entries, or entries that contain only 0 or 1 values. However, ternary CAMs (TCAMs) may be preferred over binary CAMs, if enhanced flexibility is desired for storing or searching through the database entries. This is because TCAMs store ternary entries, or entries that contain 0, 1 and x values, where x is referred to as a "wildcard" or "don't care"

specification. In some embodiments, a pseudo-ternary CAM may be used for storing a group of entries with a shared mask.

When data packets arrive at input port 330, HCA 320 parses the packet headers, and forms keys (i.e., search keys) for searching an appropriate ACL table within the TCAM array 350. The appropriate ACL table might be based on factors, such as the interface on which the packet arrived. A typical ACL search key may contain the following fields: <ACL-ID>, <PROTOCOL>, <SOURCE-IP>, <DESTINATION-IP>, <SOUCE PORT>, <DESTINATION PORT>. When provided with a search key, a parallel search is performed on all ACL entries stored in the appropriate TCAM. In some cases, the search may return the index of the first ACL entry that matches the search key. In other cases, multiple matching indices may be returned. Regardless, a memory location corresponding to the result index stores the action to be taken when an ACL entry matching the search key is found. Typical actions include permit/deny, update counters and replicate port.

TCAMs typically constitute a significant portion of the cost of a multi-gigabit linecard. For example, the price for a 10 gigabit linecard in the next couple of years is expected to be less than a thousand dollars. However, TCAMs supporting 128K entries of 144-bit width are expected to cost over $200 for the next few years. Therefore, TCAMs must be utilized as efficiently as possible to provide efficient, low cost multi-gigabit linecards.

Today, state-of-the-art TCAMs provide 18M ternary bits organized into 32, 64 or 128 blocks. Each block can be independently configured to have a width of 72, 144, 288 or 576 bits. After the relevant fields of an ACL rule are encoded within a TCAM, there are typically some "extra bits" that are left unused. For example, most IPv4 ACL databases consist of an ACL identifier and protocol field (8 bits), a destination address (32 bits), a source address (32 bits), a destination port (16 bits) and a source port (16 bits)—a total of 104 bits. In some cases, 4 additional bits may be used for encoding miscellaneous fields, bringing the total to 108 bits. In this manner, 36 extra bits may remain unused in TCAMs that are 144 bits wide.

I. Exemplary Methods for Encoding a Range Field within a TCAM Device

TCAMs are well suited for storing ACL tables that have rules with "don't care" specifications. An ACL rule [R] typically includes a collection of [i] fields. Each field [$R_i$] in an ACL rule can specify one of three matches: an exact match, a prefix match or a range match. A rule with at least one field having a range match specification is referred to as a "range rule". In addition, a "range match specification" is a range of values, $R_i$=[$start_i$, $end_i$], specified for a particular ACL rule field [i]. When searching an ACL table, a packet header field, $H_i$, may be considered a "range match" for the range match specification, $R_i$, if and only if $start_i \leq H_i \leq end_i$.

However, due to the size of range match specifications, and because TCAMs store only 0, 1 and x (don't-care) states, "range rules" typically cannot be stored directly within a TCAM. Although several methods have been proposed for representing range rules in TCAMs, the previously disclosed methods consume a large number of TCAM entries, and therefore, fail to utilize TCAM storage space efficiently.

One method for representing range rules in TCAMs is to expand each range into a set of prefixes, which can then be stored directly as TCAM entries. For example, a single range field, $R_i$=[$start_i$, $end_i$], can be split into several TCAM entries by enumerating the set of "prefixes" that are "contained" in that range. One exemplary manner in which this may be done is described in a conference publication entitled "Fast scalable level-four switching," Srinivasan et al., ACM SIGCOMM Computer Communication Review, 1998 Volume 28, Issue 4, pages 191-202, which is hereby incorporated by reference herein in its entirety. For rules with two range fields, the cross-product of the set of prefixes for the first field and the set of prefixes for the second field may be used to get the set of TCAM entries.

When encoding range fields using the above prefix expansion technique, the maximum number of TCAM entries consumed (i.e., the worst-case expansion) for a range field of width, W, is 2W−2. For example, consider the range [1, 2W−2]. The smallest set of prefixes needed to cover this range is 01*, 001*, 0001* ... $0^{W-1}$1, 10*, 110* ... $1^{W-1}$0. Thus, for a 4-bit field, the range [1, 14] expands to 0001, 001*, 01*, 10*, 110*, 1110; a worst-case expansion of 6. For a 16-bit range field, the worst-case expansion is 30. Hence, an IP ACL rule which has two 16-bit port fields (e.g., source and destination port fields) can expand to $(2W-2)^2$=30×30=900 TCAM entries in the worst case.

To reduce the expansion of rules, additional bits in the TCAM array may be used to encode the ranges that appear frequently in the database. For example, a range preclassifier may be used for assigning a unique code to a small number of distinct ranges that are known to occur in a database. In one embodiment, the range preclassifier may inspect the database and assign codes to the "top n" unique ranges. For a database with a small number of unique ranges, a bit can be assigned for each of the "top n" ranges. However, n extra bits per TCAM entry will be needed in this embodiment to achieve a worst case expansion of 1. Since the number of extra bits in a TCAM array is limited, the simple scheme does not easily scale to databases with a large number of unique ranges. In addition, the preclassifier method requires knowledge of a particular database, which may not be available prior to searching.

Another method for representing range rules in a TCAM array involves dividing a range field into "chunks," where each chunk is mapped into a TCAM entry using 1-hot (or "unary") encoding. Examples of this method are described in U.S. patent application Ser. No. 10/897,062, entitled "RANGE CODE COMPRESSION METHOD AND APPARATUS FOR TERNARY CONTENT ADDRESSABLE MEMORY (CAM) DEVICES." In general, the unary encoding scheme disclosed in the commonly assigned patent application encodes range fields by looking at multiple bits at a time. This reduces the worst case expansion of a W-bit range field from 2W−2 to W−1 TCAM entries. For example, the unary encoding scheme reduces the worst case expansion of a 16-bit range field from 30 to 15. However, the unary encoding scheme achieves this reduction by using an extra W-bits in each TCAM entry. For example, an extra 16 bits (for a total of 32 bits) may be used within each of the 15 TCAM entries consumed by the encoded 16-bit range field. Clearly, larger bit ranges would require an even greater number of extra bits per TCAM entry, a requirement which may not be supported by the number of extra bits actually available in the TCAM array (e.g., 36 extra bits in many TCAMs with 144 bit widths).

Therefore, a need remains for a database-independent range encoding scheme that reduces the number of TCAM entries required to encode a range field, even in the worst case. A preferred encoding scheme would also reduce the number of extra bits per TCAM entry needed to encode the range field. Exemplary embodiments for an improved encoding scheme will now be described in reference to FIGS. 4-8.

The improved encoding method described herein is based on two simple ideas. First, a range field is represented as a collection of ternary values, rather than a collection of prefixes. Second, additional unused bits in a TCAM entry can be used to encode the ternary strings. This enables the ternary values to be wider than the prefixes. However, the method described below requires fewer ternary values than a corresponding number of prefixes, even in the worst case. Since TCAMs come in predefined widths, extra bits are typically available in each TCAM row "for free" after the necessary bits are used to store a rule. For now, let us assume that there is no restriction on the number of extra bits available for use in a TCAM entry.

FIG. 4 illustrates the concept of forming ternary entries using additional bits and an improved encoding scheme—referred to herein as fence encoding—for ranges of the form "≧" on a 2-bit range field. Using prefix expansion, the worst-case expansion of any range within a 2-bit range field would be 2W−2=2. If unary encoding is used, the worst-case expansion of any range within a 2-bit range field would be reduced to W−1=1. This is because the prefix expansion method encodes ranges by looking at only 1 bit at a time, whereas unary encoding looks at 2 (or more) bits at a time. However, unary encoding requires an extra W bits to provide a worst-case expansion of one. In embodiments of the present invention, the worst-case expansion is reduced (e.g., by looking at more than 2 bits at a time) without significantly increasing the number of extra bits needed per TCAM entry to represent the range. For example, the worst-case expansion can be reduced to one TCAM entry by using three bits to represent a 2-bit range (instead of the two bits provided by prefix encoding, or four bits provided by unary encoding). In the fence encoding scheme described below, the search key for the range field $(b_1 b_0)$ is augmented with an extra bit $(b_{ex})$ using the equation $b_1$ OR $b_0$. In the example of FIG. 4, the extra bit encodes whether the search key is a member of either 01 or 1x for ranges ≧1.

FIG. 5 illustrates the concepts of the fence encoding scheme for various types of ranges (e.g., =i, ≧i, <i and [i, j]) on a k-bit range field. For example, the fence encoding representation of the number i consists of $2^k-i-1$ zeros (0's) followed by i ones (1's). The fence encoding representation consists of $2^k-i-1$ "don't cares" (x's) followed by i ones for ranges ≧i, and $2^k-i$ zeros followed by i−1 "don't cares" for ranges <i. Finally, the fence encoding representation of the range [i, j] consists of $2^k-j-1$ zeros followed by j−i "don't cares" followed by i ones. Thus, to encode k-bits using the fence encoding scheme described herein, at least $2^k-1$ bits may be needed to achieve a worst-case expansion of one. However, since there are already k-bits in the range field, only $(2^k-1)-k$ additional bits are needed for the range expansion (e.g., for k=2, only 1 additional bit is needed). This is an improvement over the unary encoding scheme, which requires an additional $2^k-k$ bits (e.g., for k=2, an additional 2 bits are needed).

Since the number of unused bits in a TCAM array is generally much smaller than $(2^k-1)-k$, the natural question is whether the available unused bits may be used in a database-independent way to reduce the expansion of the database at all (if not to reduce the expansion all the way to one).

In one embodiment, such a result is achieved by generalizing the fence encoding technique. To form the ternary representation of a W-bit range field, the field is divided into multiple chunks, where each chunk represents a contiguous portion of the bits of W, and each chunk is mapped into a single TCAM entry. For example, if the W-bit range field is split into l chunks, with chunk i having $k_i$ bits, then the range field may be split into $(k_0+k_1+\ldots+k_{l-1})$. Here, $k_0$ corresponds to the most significant $k_0$ bits, $k_1$ corresponds to the next $k_1$ most significant bits, and so on. Now, the value in the bit-strings corresponding to each of the chunks is mapped to their fence encoding, i.e., each of the $k_i$ bits is represented using $2^{k_i}-1$ bits. The width of the fence encoded range field is, therefore, $W'=(2^{k_0}-1)+\ldots+(2^{k_{l-1}}-1)$. However, since each chunk consumes only one TCAM entry, the worst-case expansion of the W-bit range field is 2l−1.

FIG. 6 provides a comparison of the encoding results obtained on various 2-bit range fields using prefix encoding, unary encoding and the new fence encoding technique described herein. As noted above, the worst-case expansion of a 2-bit range field is always 2 when prefix encoding is used. Unary encoding and fence encoding both reduce the worst-case expansion of a 2-bit range field to one. However, unary encoding requires W extra bits (in this case, 2 extra bits) to achieve a worst-case expansion of one, whereas fence encoding requires only W/2 bits (in this case, 1 extra bit). Further comparison of encoding results and examples of fence-encoding approaches are described in a conference publication entitled "Algorithms for Advanced Packet Classification with Ternary CAMs," Lakshminarayanan et al., ACM SIGCOMM '05, Aug. 21-26, 2005, Philadelphia Pa., which is hereby incorporated by reference in its entirety.

FIG. 7 provides pseudo-code for one embodiment of the improved range encoding scheme disclosed herein. As shown in FIG. 7, the method may begin by dividing a W-bit range field into multiple chunks (e.g., l chunks) or "levels." These chunks may also be referred to herein as "split chunks." As noted above, each split chunk i may include a certain number of $k_i$ bits. The number of $k_i$ bits included within each split chunk i may be the same, or may differ between chunks. For example, a 16-bit range field may be divided into: five split chunks of 4, 3, 3, 3 and 3 bits; four split chunks of 4, 4, 4 and 4 bits, or three split chunks of 6, 5 and 5 bits, among others. Next, the method may process each split chunk one at a time. For example, for each split chunk i, the value of the $k_i$ bits may be mapped into a TCAM entry using the fence encoding scheme described below. As noted above, such mapping may consume $2^{k_i}-1$ bits of each TCAM entry to achieve a worst-case expansion of one.

The fence encoding scheme will now be described in more detail in reference to FIG. 7. Let R=[s, e] denote the range of a W-bit range field. To represent the range (R) in ternary values, the method may first determine whether the start (s) and end (e) values are the same (i.e., if s=e). If so, the method may end after returning the TCAM encoding of s. As noted above, fence encoding can be used to map a W-bit range field into $2^W-1$ TCAM bits to achieve a worst case expansion of one. For example, a 3-bit range field can be encoded into $2^3-1=7$ TCAM bits. As shown in FIG. 5, the fence encoding representation of the number i is $2^k-i-1$ zeros (0's) followed by i ones (1's) for a k-bit range field. This corresponds to $2^W-s-1$ zeros (0's) followed by s ones (1's) to represent the number s in the current example of a W-bit range field. Therefore, to represent a 3-bit range with identical start and end values (e.g., R=[3:3]), the method would return $2^3-3-1=4$ zeros (0's) followed by 3 ones (1's), or [0000111].

If the start (s) and end (e) values differ, the W-bit range field is split into l chunks, where split chunk (c) is defined, such that $v_{sc} \neq v_{ec}$ and $v_{si}=v_{ei}$ for all i<c. In the split chunk case, $v_{si}$ and $v_{ei}$ denote the start and end values of the chunk i, respectively. In addition, $v_{sc}$ and $v_{ec}$ are used to denote the start and end values of the chunk c, where c is the first level in which the start and end values differ. The W-bit field can be divided into several chunks, with each chunk being a different number of bits.

To illustrate this concept, assume that an 8-bit range field, R=[013–066], is divided into 3 chunks, where $k_0=2$, $k_1=3$ and $k_2=3$. The first chunk represents a first range of values, R[0]= [02x–05x], which definitely fall within the original range (i.e., all three-bit values between 20 and 59 are known to fall within the original range). The second chunk represents a second range of values, R[1]=[013–017], that are greater than or equal to the start value, but less than the first range of values (i.e., all three-bit values between 13 and 17). The third chunk represents a third range of values, R[2]=[060–066], that are greater than the first range but less than the end value (i.e., all three-bit values between 60 and 66).

After the original range is split into chunks, each split chunk is encoded according to the fence encoding scheme shown in FIG. 5. For example, each chunk will be encoded into $W'=(2^{k_0}-1)+(2^{k_1}-1)+(2^{k_2}-1)$ bits. In the current example, the chunks will each be encoded into $W'=(2^2-1+2^3-1+2^3-1)=3+7+7=17$ bits. As described in more detail below, the worst case expansion for each split chunk is 1, resulting in an overall worst-case expansion of only 3 ternary entries.

To encode the split chunks, the formulas shown in FIG. 5 are applied to each chunk position within the starting and ending values of each split chunk range. For example, to encode the first range of values, R[0]=[02x–05x], the first chunk position [0-0] is represented as "000", the second chunk position [2-5] is represented as "00xxx11," and the third chunk position [x-x] is represented as "xxxxxxx." Note that within the range, R[0]=[02x–05x], the first chunk position is represented by a $2^2-1=3$-bit number, while the second and third chunk positions are represented by $2^3-1=7$-bit numbers (i.e., 3-bit octal numbers). This is due to the original range being divided into three chunks of $k_0=2$, $k_1=3$ and $k_2=3$ bits each. Following the algorithm, the ternary entries needed to represent R are {02x–05x=000 00xxx11 xxxxxxx, 013–017=000 0000001 xxxx 111, 060–066=000 0111111 0xxxxxx}—a total of 3 ternary entries.

For each range field, the fence encoding of a W-bit range field with k-bit chunks results in W/k chunks. Each of the chunks takes $2^k-1$ bits to represent within a single TCAM entry, leading to a total of $(2^k-1)*W/k$ bits to represent the entire range rule. Since the range field already consumes W bits, the extra bits needed to encode the range field is $(2^k-1)*W/k-W$. The worst case expansion is therefore 2W/k−1, since there can be two TCAM entries corresponding to each of the W/k chunks (e.g., one T CAM entry corresponding to the start of the chunk and one TCAM entry corresponding to the end of the chunk) except the first chunk, which can have at most one TCAM entry (e.g., corresponding to all values that are strictly between the start and end values of the first chunk). For example, the worst-case expansion for the above-mentioned fence encoding scheme is 2W−1 when one bit is encoded at a time (i.e., when k=1), W−1 when two bits are encoded at a time (i.e., when k=2), W/2−1 when four bits are encoded at a time (i.e., when k=4), etc.

FIG. 8 illustrates alternative ways to fence encode a 16-bit range field. For example, the range field may be encoded by splitting the range field into 16, 8, 5, 4 or 3 chunks (or levels). The number of bits processed per level may be the same (e.g., 4, 4, 4, 4) or may differ (e.g., 6, 5, 5) between levels. In addition, FIG. 8 shows that both the worst case expansion and the number of additional bits needed per TCAM entry strongly depend on the number of split chunks or levels. For example, a fence encoding scheme that processes only one bit at a time (i.e., divides a 16-bit range field into 16 chunks) may provide a worst-case expansion of 30 TCAM entries per rule, consuming 0 extra bits per TCAM entry. This is similar to the results provided by the prefix encoding scheme, as discussed above. However, a fence encoding scheme that divides the range field into five chunks (e.g., 4, 3, 3, 3, 3) could be used to reduce the worst-case expansion from 30 TCAM entries per rule to 9 TCAM entries per rule. Such encoding would consume 27 extra bits per TCAM entry, leaving 9 extra bits for other purposes (recall, there are typically 36 extra bits available in a 144-bit wide TCAM for encoding range rules). In one example, the 9 remaining bits could be used to encode frequently used ranges to achieve better real-life capacity).

In some cases, the additional bits required to achieve a particular worst-case expansion may cause the TCAM entry to become longer. For example, FIG. 8 shows that 109 extra bits may be needed to achieve a worst-case expansion of 5 TCAM entries per rule. If the original size of a TCAM entry is only 144 bits, each fence encoded TCAM entry would occupy twice the number of TCAM rows, essentially increasing the worst-case expansion from 5 to 10 TCAM entries. Therefore, one should typically consider the number of "free" bits available in a TCAM entry before deciding on the number of levels and the number of bits to process per level.

FIG. 9 illustrates exemplary fence encoding results obtained on a real-life ACL database containing approximately 215,000 rules. In particular, FIG. 9 shows the worst-case expansion (denoted in number of TCAM entries), the expansion factor (denoted in # of TCAM entries/# of rules) and the increase in database capacity provided by encoding range rules using the fence encoding scheme described herein for various numbers of extra bits. As shown in FIG. 9, increasing the number of extra bits used per TCAM entry may significantly decrease the worst-case expansion and increase the database capacity. For example, using 36 extra bits per TCAM entry may decrease the worst-case expansion from 30 to 8 TCAM entries, which may increase the overall capacity of the database by approximately 71%.

Figure 10:
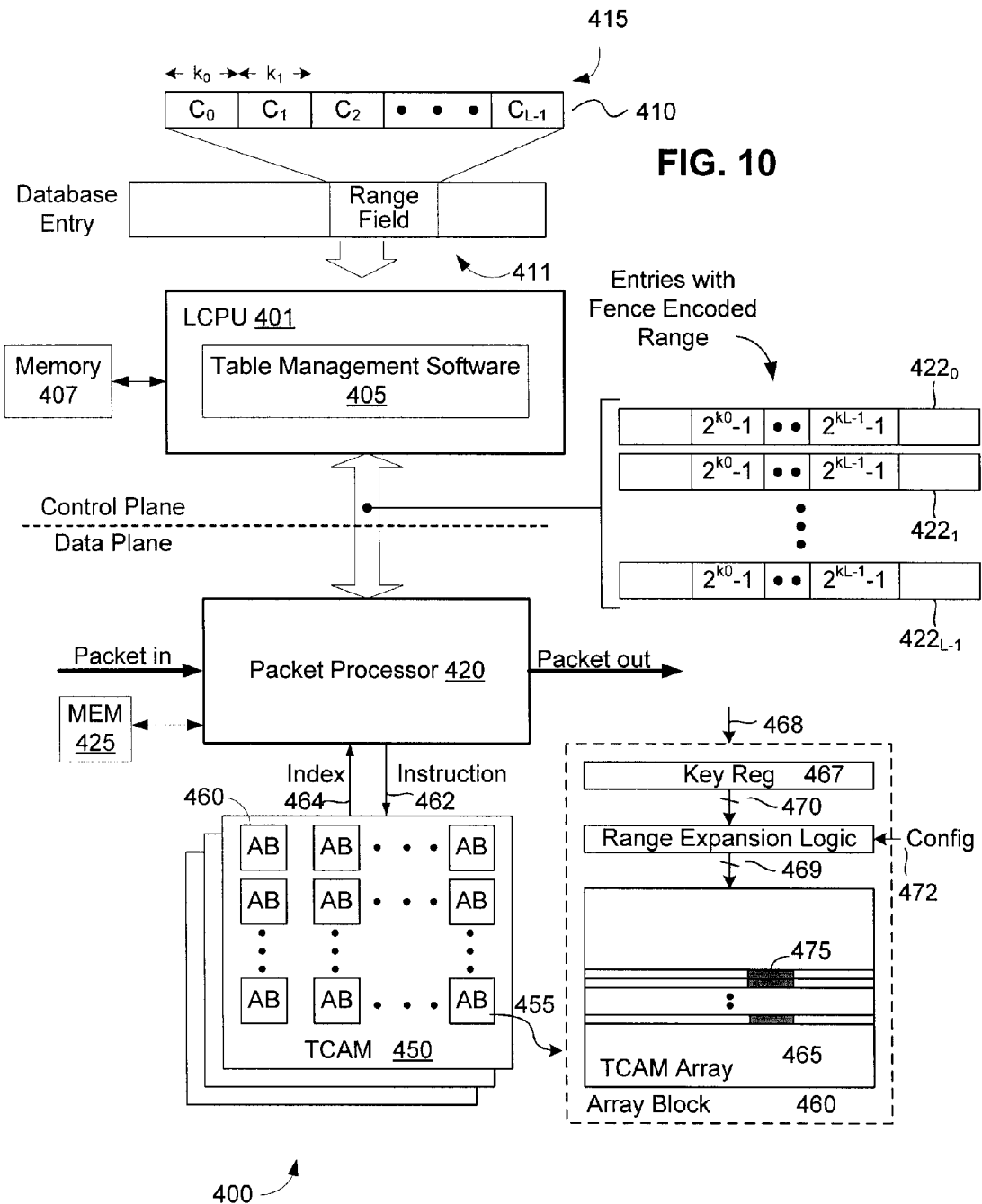
FIG. 10 illustrates an embodiment of a line card having support for fence-encoded range fields.

FIG. 10 illustrates an embodiment of a line card 400 having support for fence-encoded range fields. The line card 400 includes a line card CPU 401 (LCPU) having table management software 405 and a separate or integrated memory 407. The line card 400 also includes a packet processor 420, associated memory 425, and one or more ternary content addressable memories (TCAMS) 450. As described above, the line card CPU 401 generally performs control plane functions for managing contents and configuration of databases within the TCAMs 450 (operations generally referred to herein as table management), while the packet processor 420 generally performs data plane functions to process each incoming packet ("Packet in") and forwards selected output packets ("Packet out") in accordance with lookup results obtained from the TCAMS 450. As discussed, the TCAMS 450 may be used to store one or more databases of ACL rules (or other lookup values) useful for processing traffic in a packet-switched communications network.

Starting with control plane operations, when a new database entry 410 containing a range field 411 is supplied to the line card CPU 401 for insertion into one or more TCAM databases, the line card CPU 401 may execute instructions included within table management software 405 (which may be stored in memory 407 or another storage external to line card CPU 401) to resolve the range field into L chunks (415) of equal or different numbers of bits, $K_0, K_1, \ldots K_{L-1}$. Each of the chunks 415 may then be encoded under program control (or through dedicated hardware operation) using the fence encoding approach, for example, described in reference to FIG. 7, to yield a set of L entries $422_0$-$422_{L-1}$ with fence-encoded chunks (collectively forming a fence-encoded range). As shown within entries 422, the number of constituent bits within each chunk is expanded as a result of the fence encoding to include $2^{ki}-1$ bits, where i is the chunk index and thus denotes the particular value of k for that chunk.

The line card CPU 401 transmits the fence-encoded entries $422_0$-$422_{L-1}$ to the packet processor 420 which issues write instructions via path 462 to one or more of TCAMs 450 to store the entries 422 in one or more databases therein. As described above and shown in FIG. 10, each TCAM 450 may include multiple array blocks 460, each of which includes a TCAM array for storing a respective database (databases may also span multiple array blocks and/or one or more array blocks may be used to store multiple databases that are, for example, distinguished through tag-identifier bits). Thus, each individual database may be populated with entries having different types of range encoding formats, as necessary to meet application demands. For example, and without limitation, a database containing fence-encoded entries may be stored within one or more of the array blocks 460, while databases of unary-encoded entries, prefix-expanded entries, bit-mapped ranges (i.e., tag bits to indicate range) and so forth are stored in databases within others of the array blocks 460. Though not specifically shown, each TCAM 450 may additionally include control circuitry to respond to incoming instructions (e.g., database read/write/delete instructions, search instructions, configuration instructions and so forth), read/write circuitry to write entries within address selected rows of address-selected array-blocks 460, and result encoding circuitry to encode match results (e.g., hit/miss signal and block match address) into one or more finalized results (indices and corresponding hit/miss signals) that are returned to the packet processor via index path 464.

Referring to detail view 455, each of the array blocks 460 may include a key register 467 to store a search key 468 received from the packet processor 420 (e.g., via instruction path 462 or another path, not shown) and range expansion logic 469 to expand selected fields within the stored search key 470 in accordance with a configuration value 472. The configuration value 471 may be stored, for example, within a programmable register within the corresponding array block 460 or elsewhere within the TCAM 450, and generally indicates the location and encoding arrangement of one or more range fields 475 within the TCAM array 465, thereby enabling the search key 470 to be expanded in accordance with the range-encoding format. For example, in one embodiment, the configuration value 472 indicates the bit offset and bit-length of each range field within the search key (i.e., a field within the search key that corresponds to encoded range fields within the database), the number and bit-length of chunks within each range field, and the type of encoding used for each range field (note that different types of encoding may be used for different range fields within the database). Accordingly, the search key 470 within the key register (which may alternatively be disposed after the range expansion logic 469) is expanded according to the range encoding format (i.e., field location, chunk distribution, chunk size and encoding type) to match the range encoding format of the database and then applied to the TCAM array 465 in a database search operation.

FIG. 11 illustrates an embodiment of field expansion logic 500 that may be used within range expansion logic 469 of FIG. 10 to perform chunk-based fence encoding on a sixteen bit search field 510 within a search key. As shown, the field expansion logic 500 includes chunk distribution logic 501 to distribute chunks 518 of the 16-bit search field 510 to respective fence-encoder circuits $503_0$-$503_7$ (i.e., FE0-FE7), and bit steering logic 505 to receive fence-encoded outputs 520 from the fence-encoder circuits 503 and steer selected bits of the fence-encoded outputs 520 to compare-line drivers via output path 515. The compare-line drivers (not specifically shown), then drive corresponding search bits onto compare lines of a ternary CAM array to effect a search operation. Note that output path is shown as including a 16-bit portion 516a that corresponds to the original 16-bit search field 510, and a 44-bit portion 516b that constitute additional bits that result from the fence-encoding. Note that the additional 44-bits (or any portion thereof actually used in a fence-encoding application) may be provided to columns within the CAM array that are adjacent or non-adjacent to the columns that receive 16-bit portion 516a.

In the particular embodiment shown, a configuration value 528 is supplied to a decoder circuit 507 which issues chunk distribution control signals 512, fence encoder control signals 514 and bit steering control signals 516 to the chunk distribution logic 501, fence encoder circuits 503 and bit steering logic 505, respectively. Referring to table 525, in one embodiment, the configuration value 528 is a three-bit value (e.g., part of larger configuration value provided to a range expansion logic circuit, such as configuration value 472 of FIG. 10) that specifies one of seven different chunk distribution patterns (more or fewer chunk distribution patterns may be specified by a differently sized configuration value 528 in alternative embodiments). As shown, when the configuration value 528 is '000', the incoming sixteen-bit search field 510 is split into eight 2-bit chunks ("2/2/2/2/2/2/2/2"), and each of the eight fence encoders FE7-FE0 is enabled to perform a 2:3 fence encoding operation (e.g., as shown by the equality operation in FIG. 5 and, at least in this 2-bit chunk case, by the equality ranges [0,0], [1,1], [2,2] and [3,3] in FIG. 6), thus converting each 2-bit chunk 518 into a respective 3-bit fence-encoded value 520. Accordingly, the bit steering logic 505 receives the 3-bit output from each of the eight fence-encoders 503 and thus outputs a 24-bit fence-encoded range value to the compare line drivers to be compared with corresponding fence-encoded fields within the TCAM array. Thus, in the uniform 2-bit chunk size mode, only eight additional bits are generated and therefore only a subset of the lines within path 516b are used.

Still referring to table 525, when the configuration value is '001', the incoming sixteen-bit search field is split into four 4-bit chunks, and the four left-most fence encoders, FE7-FE4, are enabled to perform respective 4:15 fence encoding operations (i.e., converting k bits to $2^k-1$ bits), thus converting each 4-bit chunk into a respective 15-bit fence-encoded value. As shown, the bit steering logic 505 receives the 15-bit output from each of fence encoders FE7-FE4 and therefore outputs a 60-bit fence-encoded range to the compare line drivers to be compared with corresponding fence-encoded fields within the TCAM array. Note that for config='001', fence encoders FE3-FE0 are unused and thus may be disabled as indicated by the notation '--' within table 525, and the outputs of those encoders is also unused within the bit steering logic 505.

When the configuration value is '010', an uneven chunk-size distribution is specified, with the incoming sixteen-bit search field is split into four 3-bit chunks and a single 4-bit chunk. In this case, the five left-most fence encoders, FE7-FE3, are enabled to perform respective fence encoding operations (i.e., 3:7 within encoders FE7-FE4, and 4:15 within encoder FE3), thus converting the four 3-bit chunks into respective 7-bit fence-encoded values, and the 4-bit chunk into a 15-bit fence-encoded value. As shown, the bit steering logic 505 receives the 7-bit output from each of fence encoders FE7-FE4, and the 15-bit output from fence encoder FE3, and outputs the resulting 43-bit fence-encoded range to the compare line drivers to be compared with corresponding fence-encoded fields within the TCAM array. For configuration values '011', '101', and '110', uneven chunk distributions are also selected, with the 4-bit chunk being shifted to respective sub-fields within the sixteen-bit search field.

FIG. 12 illustrates an embodiment of a fence-encoding circuit 550 that may be used within the field expansion logic of FIG. 11. As shown, a three-bit fence-encoder control signal 514 is supplied to respective lookup circuits $551_0$-$551_2$ and to multiplexer 553. In one embodiment, each of the lookup circuits is enabled by a respective component signal of the three-bit control signal 514 to perform a lookup operation, indexing a table of encoded values based on the incoming chunk bits 518 and outputting the corresponding fence-encoded value. Thus, when enabled, lookup circuit $551_0$ indexes a 16-entry table of 15-bit fence-encoded values based on an incoming 4-bit chunk and outputs the corresponding fence-encoded value (i.e., the fence-encoded value corresponding to the 4-bit chunk in accordance with the equality row "=i" within the table of FIG. 5). Lookup circuits $551_1$ and $551_2$ similarly perform fence-encoded-value lookups based on 3-bit and 2-bit chunks when enabled by control signal 514 and thus yield 7-bit fence-encoded values and 3-bit fence-encoded values, respectively. Multiplexer 553, which may be implemented by virtually any type of selection circuit (including a wired-OR arrangement), outputs the looked-up fence-encoded value as a selected fence-encoded value 520.

In an alternative embodiment, each of the lookup circuits 551 or any one of them may be replaced by a combinatorial logic circuit that operates in accordance with a desired fence-encoding scheme to produce a fence-encoded output. FIG. 13, for example, illustrates a combinatorial logic circuit 570 including AND gate 571 and OR gate 573 that operate to convert a two-bit input chunk ($b1_{in}$, $b0_{in}$) into a three-bit fence-encoded value ($b2_{FE}$, $b1_{FE}$, $b0_{FE}$) in accordance with the equality expression set forth in FIG. 5. Similar combinatorial logic circuits may be constructed for lookup circuits $551_1$ and $551_2$ of FIG. 12.

The fence encoding scheme described herein provides significant reduction in both the number of TCAM entries and the number of extra bits per TCAM entry that are needed to store encoded range fields. Unlike some prior art methods, the encoding scheme disclosed herein can be used to reduce the worst case storage requirements without prior knowledge of a database, and can be scaled to databases with a large number of unique fields. In addition, the improved encoding scheme provides fast updates and can be performed on existing TCAM devices without hardware modification.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

It will be appreciated to those skilled in the art having the benefit of this disclosure that this invention is believed to provide an improved method for encoding a range of values within a TCAM device. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than restrictive sense.

What is claimed is:

1. A method of operation within a packet processing device, the method comprising:
   receiving first and second k-bit values that bound a range of values; and
   encoding the range bounded by the first and second k-bit values into an encoded value having not more than $2^k-1$ bits, wherein encoding the range bounded by the first and second k-bit values into an encoded value comprises:
   (i) assigning a first number of bits in a first logic state to be left-justified bits of the encoded value, the first number of bits corresponding to the lower of the first and second k-bit values;
   (ii) assigning a second number of bits in the first logic state to be right-justified bits of the encoded value the second number of bits being $2^k-1$ less the higher the first and second k-bit values; and
   (iii) assigning a third number of bits in a masked state to be contents of the encoded value between the left-justified and right-justified bits of the encoded value, the third number of bits being the difference between the first and second k-bit values, plus one.

2. The method of claim 1 further comprising storing the encoded value within a first entry in a ternary content addressable memory (CAM) device.

3. The method of claim 1 further comprising:
   receiving a search value within the ternary CAM device;
   encoding a k-bit field within the search value to form an expanded search value having at least an additional $2^k-1$ bits; and
   comparing the expanded search value with entries, including the first entry, within the TCAM device.

4. The method of claim 1 wherein assigning a first number of bits in the first logic state comprises assigning the first number of bits in a logic '0' state.

5. The method of claim 1 wherein each of the first and second k-bit values is part of a respective M-bit value, where M>k.

6. The method of claim 1 wherein the first and second k-bit values are 2-bit values.

7. A method of operation within a content addressable memory (CAM) device, the method comprising:
   encoding at least one group of k bits within a search value into an encoded bit field within an encoded search value, the encoded bit field having $2^k-1$ bits wherein encoding the at least one group of k bits into an encoded bit field having $2^k-1$ bits comprises:
   assigning a first number of bits in a first logic state to be left-justified bits of the encoded bit field, the first number of bits corresponding to the numeric value represented by the k bits; and
   assigning a second number of bits in a second logic state to be right-justified bits of the encoded bit field, the second number of bits being $2^k-1$ less the first number of bits; and
   comparing the encoded search value with data stored within the CAM device.

8. The method of claim 7 further comprising receiving a value that indicates a position of the at least one group of k bits within the search value.

9. The method of claim 8 further comprising storing the value that indicates the position within a programmable register of the CAM device.

10. The method of claim 7 further comprising receiving a value that indicates the number of bits, k, within the at least one group of k bits.

11. The method of claim 10 further comprising storing the value that indicates the number of bits, k, within a programmable register of the CAM device.

12. The method of claim 7, wherein the first logic state is a logic '0' state and the second logic state is a logic '1' state.

13. A content addressable memory (CAM) device comprising:
   a key expansion circuit to receive a search value and to encode at least one group of k bits within the search value into an encoded bit field within an encoded search value, the encoded bit field having $2^k-1$ bits, wherein the key expansion circuit comprises circuitry to assign a first number of bits in a first logic state to be left-justified bits of the encoded bit field, and a second number of bits in a second logic state to be right-justified bits of the encoded bit field; and
   a CAM array coupled to receive the encoded search value and having a plurality of CAM cells to store data and to compare the data to the encoded search value.

14. The CAM device of claim 13 further comprising a configuration register to store a value that indicates a position of the at least one group of k bits within the search value.

15. The CAM device of claim 13 further comprising a configuration register to store a value that indicates the number of bits, k, within the at least one group of k bits.

16. The CAM device of claim 13 wherein the first logic state is a logic '0' state and the second logic state is a logic '1' state.

17. A content addressable memory (CAM) device comprising:
   means for receiving a search value and encoding at least one group of k bits within the search value into an encoded bit field within an encoded search value, the encoded bit field having $2^k-1$ bits, wherein encoding at least one group of k bits within the search value comprises:
   assigning a first number of bits in a first logic state to be left-justified bits of the encoded bit field; and
   assigning a second number of bits in a second logic state to be right-justified bits of the encoded bit field; and
   means for storing data and comparing the data to the encoded search value.

18. Computer-readable media having information embodied therein that includes a description of a content addressable memory (CAM) device, the information including descriptions of:
   a key expansion circuit to receive a search value and to encode at least one group of k bits within the search value into an encoded bit field within an encoded search value, the encoded bit field having $2^k-1$ bits, wherein the key expansion circuit comprises circuitry to assign a first number of bits in a first logic state to be left-justified bits of the encoded bit field, and a second number of bits in a second logic state to be right-justified bits of the encoded bit field; and
   a CAM array coupled to receive the encoded search value and having a plurality of CAM cells to store data and to compare the data to the encoded search value.

* * * * *